United States Patent
Sel et al.

(10) Patent No.: US 9,613,806 B2
(45) Date of Patent: *Apr. 4, 2017

(54) TRIPLE PATTERNING NAND FLASH MEMORY

(71) Applicant: SanDisk Technologies LLC, Plano, TX (US)

(72) Inventors: Jongsun Sel, Los Gatos, CA (US); Tuan Duc Pham, San Jose, CA (US); Mun Pyo Hong, San Ramon, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 168 days.

This patent is subject to a terminal disclaimer.

(21) Appl. No.: 14/018,236

(22) Filed: Sep. 4, 2013

(65) Prior Publication Data

US 2015/0064906 A1  Mar. 5, 2015

(51) Int. Cl.
| | |
|---|---|
| *H01L 21/033* | (2006.01) |
| *H01L 21/311* | (2006.01) |
| *H01L 21/3213* | (2006.01) |
| *H01L 27/11524* | (2017.01) |

(52) U.S. Cl.
CPC .... *H01L 21/0337* (2013.01); *H01L 21/31144* (2013.01); *H01L 21/32139* (2013.01); *H01L 27/11524* (2013.01)

(58) Field of Classification Search
CPC combination set(s) only.
See application file for complete search history.

(56) References Cited

U.S. PATENT DOCUMENTS

| | | | |
|---|---|---|---|
| 5,570,315 A | 10/1996 | Tanaka et al. | |
| 5,768,192 A | 6/1998 | Eitan | |
| 5,774,397 A | 6/1998 | Endoh et al. | |
| 5,887,145 A | 3/1999 | Harari et al. | |
| 6,011,725 A | 1/2000 | Eitan | |
| 6,046,935 A | 4/2000 | Takeuchi et al. | |
| 6,429,123 B1 | 8/2002 | Tseng | |
| 7,291,560 B2 | 11/2007 | Parascandola et al. | |
| 7,732,338 B2 * | 6/2010 | Narita ............. | H01L 21/0337 257/E21.24 |
| 7,951,669 B2 | 5/2011 | Harari et al. | |
| 8,557,704 B2 | 10/2013 | Wells et al. | |
| 2006/0216938 A1 * | 9/2006 | Miyagawa et al. ......... 438/692 |
| 2006/0234166 A1 * | 10/2006 | Lee et al. .................... 430/313 |
| 2007/0026684 A1 | 2/2007 | Parascandola et al. | |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Duy Deo
*Assistant Examiner* — Erin Bergner
(74) *Attorney, Agent, or Firm* — Foley & Lardner LLP

(57) ABSTRACT

A NAND flash memory array is initially patterned by forming a plurality of sidewall spacers according along sides of patterned portions of material. The pattern of sidewall spacers is then used to form a second pattern of hard mask portions including first hard mask portions defined on both sides by sidewall spacers and second hard mask portions defined on only one side by sidewall spacers.

16 Claims, 11 Drawing Sheets

(56) References Cited

U.S. PATENT DOCUMENTS

| | | |
|---|---|---|
| 2008/0008969 A1* | 1/2008 | Zhou ................ H01L 21/0337 430/313 |
| 2008/0131793 A1* | 6/2008 | Lee et al. .................... 430/5 |
| 2010/0120247 A1 | 5/2010 | Park |
| 2011/0104899 A1* | 5/2011 | Lam et al. ................. 438/691 |
| 2012/0085733 A1 | 4/2012 | Mebarki et al. |
| 2013/0065397 A1 | 3/2013 | Chen |

OTHER PUBLICATIONS

Chen et al., "Self-Aligned Triple Patterning to Extend Optical Lithography for 1x Patterning," International Symposium on Lithography Extensions, Oct. 21, 2010, 20 pages.

Notice of Allowance for U.S. Appl. No. 14/018,258 mailed May 28, 2014, 11 pages.

Office Action for U.S. Appl. No. 14/018,164 mailed Jun. 11, 2014, 8 pages.

Notice of Allowance for U.S. Appl. No. 14/018,163 mailed Sep. 29, 2014, 11 pages.

Notice of Allowance for U.S. Appl. No. 14/018,258 mailed Nov. 7, 2014, 14 pages.

\* cited by examiner

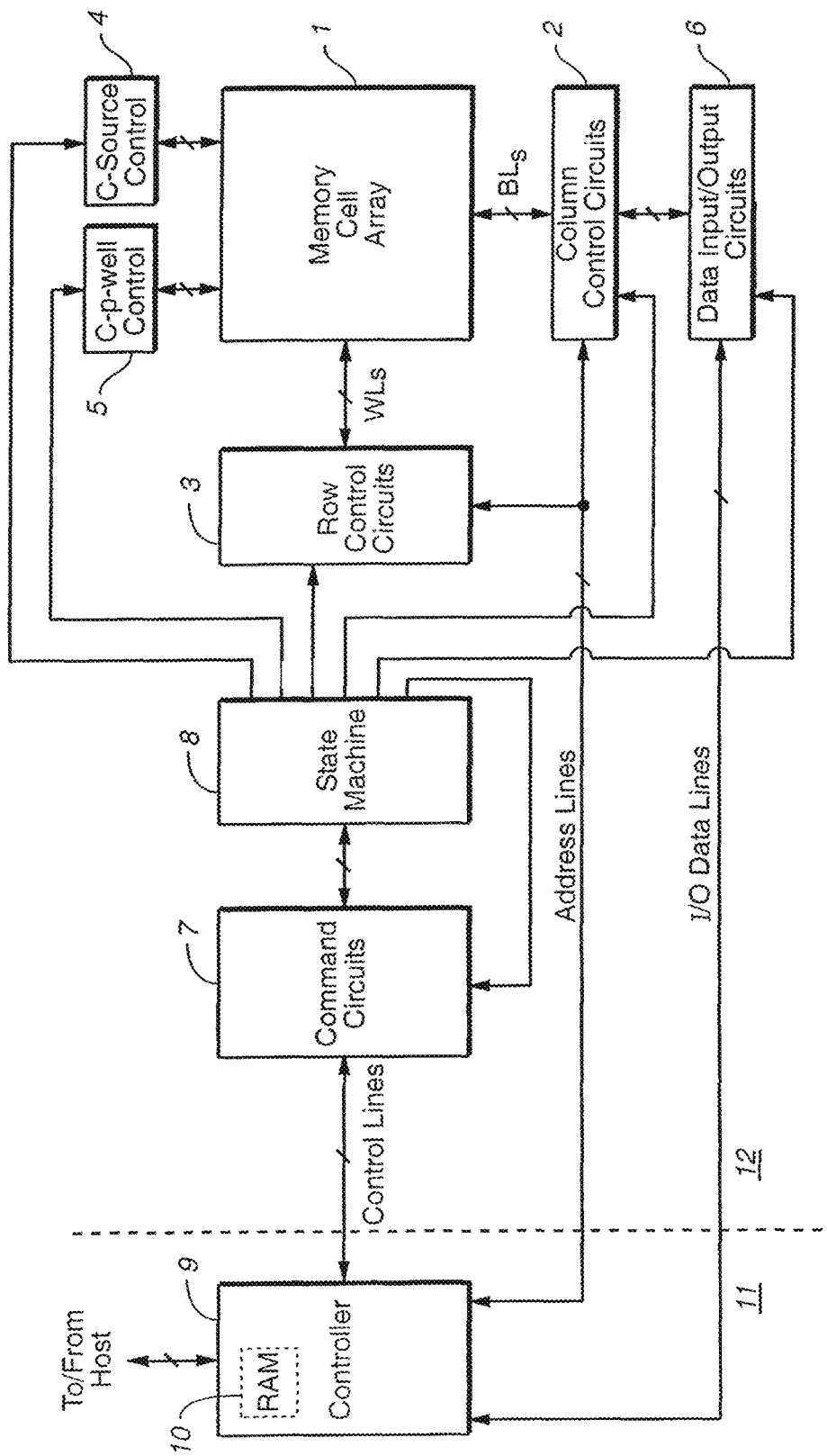
*FIG._1
(Prior Art)*

(Section A-A)

TRIPLE PATTERNING NAND FLASH MEMORY

CROSS REFERENCE TO RELATED APPLICATIONS

This application is related to "Triple patterning NAND flash memory with SOC" and "Triple patterning NAND flash memory with stepped mandrel" filed on the same date as the present application.

BACKGROUND OF THE INVENTION

This invention relates generally to non-volatile semiconductor memories of the flash EEPROM (Electrically Erasable and Programmable Read Only Memory) type, their formation, structure and use, and specifically to methods of making NAND memory cell arrays.

There are many commercially successful non-volatile memory products being used today, particularly in the form of small form factor cards, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings over rows of floating gates. Control gate lines and string select lines are formed of polysilicon (polysilicon layer 2, or "poly 2," labeled P2 in FIG. 2B, a cross-section along line A-A of FIG. 2A). Floating gates are also formed of polysilicon (polysilicon layer 1, or "poly 1," labeled P1). The control gate lines are typically formed over the floating gates as a self-aligned stack, and are capacitively coupled with each other through an intermediate dielectric layer (also referred to as "inter-poly dielectric" or "IPD") as shown in FIG. 2B. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

The top and bottom of the string connect to the bit line and a common source line respectively through select transistors (source select transistor and drain select transistor) in which the floating gate material (P1) is in direct contact with the control gate material (P2) through an opening formed in IPD material. The active gate thus formed is electrically driven from the periphery.

It is generally desirable to make memory cells as small as possible so that the number of memory cells in a given area is maximized. Thus, for example, when forming word lines, it may be desirable to make them as narrow as possible and space them as closely as possible. However, achieving such small dimensions while maintaining control of critical dimensions can be very difficult. A complex process that includes a large number of steps generally costs more and may have a lower yield and may be harder to control. Conventional photolithography is generally limited by the wavelength of light used. Alternatives such as e-beam lithography remain costly.

Thus, there is a need for a memory chip manufacturing process that uses conventional photolithography to make very small features in a manner that does not require an excessive number of layers, or process steps, and that allows good control of device dimensions.

SUMMARY OF THE INVENTION

Patterning to form integrated circuits may use sidewall spacers to generate features that are one third of the size of the smallest feature that can be achieved with direct patterning photolithography. An initial pattern of mandrels is established using photolithography with feature size D, and spacing D. Sidewall spacers are formed having a width of D/3 so that remaining gaps are D/3 wide. Mandrels are removed and a hard mask material is blanket deposited with a thickness of D/3 to fill gaps between sidewall spacers and partially fill spaces where mandrels were removed. The hard mask layer is then etched back to leave separate hard mask portions, two portions where each mandrel was removed, and one portion between sidewall spacers of neighboring mandrels. Thus, three hard mask portions, each with a lateral dimension of D/3 and spacing D/3, are formed for each mandrel with lateral dimension D and spacing D. Spin On Carbon (SOC) is a suitable material for an easily removable mandrel. Photoresist, or other material, may also be used as a mandrel. Sidewall spacers may be Silicon Dioxide or other suitable material. Hard mask material may be amorphous Silicon, Silicon Nitride, or other material.

Stepped mandrels may be formed with an upper step having a width D/3 and a lower step having a width D. Sidewall spacers may then be formed along sides of both upper and lower steps, and hard mask material may be deposited between sidewall spacers. Upper steps may then be removed to leave openings that are used to remove the middle third of lower steps, leaving two lower step portions, each D/3 wide. Subsequently, upper and lower sidewall spacers may be removed and hard mask material etched back to leave hard mask portions that include the two lower step portions.

An example of a method of forming a hard mask layer includes: forming a plurality of portions of material that have a lateral dimension D which is defined by a photolithographic process and which are separated by spaces having a lateral dimension equal to D; subsequently forming sidewall spacers along sides of the plurality of portions of material, gaps between neighboring sidewall spacers having a lateral dimension equal to D/3; subsequently removing the plurality of portions of material to leave the sidewall spacers; subsequently depositing a hard mask material on the sidewall spacers to fill the gaps between sidewall spacers and partially fill openings where the plurality of portions of material were removed; subsequently etching back the hard mask material to leave first hard mask portions filling the gaps between sidewall spacers and second hard mask portions that extend along sidewall spacers on one side and are exposed on another side; and subsequently removing the sidewall spacers.

The material may be Spin-On Carbon (SOC). The plurality of portions of SOC may be removed by dry etching. The sidewall spacers may be formed of Silicon Dioxide that is deposited at a low temperature. The hard mask material may be amorphous Silicon. The hard mask material may be Silicon Nitride. The sidewall spacers may be formed of Silicon Dioxide, a layer that directly underlies the sidewall spacers may be formed of Silicon Dioxide, and the layer that directly underlies the sidewall spacers may be patterned by an etch that also removes the sidewall spacers. Both the first and second hard mask portions may have lateral dimensions of D/3 and spacing of D/3.

An example of a method of forming an integrated circuit includes: forming a plurality of patterned portions of a first material; subsequently forming sidewall spacers along sidewalls of the plurality of patterned portions of the first material; subsequently removing the plurality of patterned portions of the first material; subsequently forming a layer of hard mask material overlying the sidewall spacers; subsequently etching back the layer of hard mask material to leave portions of the hard mask material between sidewall spacers including first portions that are in contact with sidewall spacers on both sides and second portions that are in contact with sidewall spacers on only one side; subsequently removing the sidewall spacers; and subsequently using the portions of the hard mask material to pattern one or more layers on a substrate.

The first material may be Spin-On Carbon (SOC). The sidewall spacers may be formed of Silicon Dioxide that is deposited at a low temperature. The hard mask material may be amorphous Silicon. The hard mask material may be Silicon Nitride. The sidewall spacers may be formed of Silicon Dioxide, a layer that directly underlies the sidewall spacers may be formed of Silicon Dioxide, and the layer that directly underlies the sidewall spacers may be patterned by an etch that also removes the sidewall spacers. The plurality of patterned portions of the first material may be formed having a lateral dimension determined by photolithography and the portions of the hard mask material may have a lateral dimension that is approximately one third of the lateral dimension determined by photolithography.

An example of a method of forming an integrated circuit includes: forming a plurality of patterned portions of photoresist; subsequently forming sidewall spacers along sidewalls of the plurality of patterned portions of photoresist; subsequently removing the plurality of patterned portions of photoresist; subsequently transferring a pattern formed by the sidewall spacers to form a plurality of patterned portions of a transfer material; subsequently forming a layer of hard mask material overlying the patterned portions of the transfer material; subsequently etching back the layer of hard mask material to leave hard mask portions between the patterned portions of the transfer material, the hard mask portions including first hard mask portions that are in contact with portions of transfer material on both sides and second hard mask portions that are in contact with portions of transfer material on only one side; subsequently removing patterned portions of the transfer material; and subsequently using the hard mask portions to pattern one or more layers on a substrate.

The plurality of patterned portions of photoresist may have a lateral dimension of approximately D and may be spaced apart a distance approximately equal to D, and the hard mask portions may have a lateral dimension approximately equal to D/3 and may be spaced apart a distance approximately equal to D/3. The sidewall spacers may be formed of Silicon Dioxide. The transfer material may be Spin On Carbon (SOC).

An example of a method of forming a hard mask layer includes: forming a plurality of mandrels that have a lateral dimension D which is defined by a photolithographic process and which are separated by spaces having a lateral dimension equal to D; subsequently forming sidewall spacers along sides of the mandrels, gaps between neighboring sidewall spacers having a lateral dimension approximately equal to D/3; subsequently depositing a first hard mask layer to fill the gaps between sidewall spacers; subsequently etching the plurality of mandrels; subsequently depositing a second hard mask layer to partially fill openings where the plurality of mandrels were etched; subsequently etching back hard mask material to leave first hard mask portions filling the gaps between sidewall spacers and second hard mask portions that extend along sidewall spacers on one side and are exposed on another side; and subsequently removing the sidewall spacers.

An individual mandrel may be formed of a lower layer of amorphous Silicon and an upper layer of Silicon Nitride. Etching the plurality of mandrels may remove the upper layer of Silicon Nitride from the plurality of mandrels while leaving the lower layer of amorphous Silicon substantially intact. The plurality of mandrels, and the sidewall spacers, may be formed on a Silicon Nitride etch stop layer. Subsequent to removing the sidewall spacers, the Silicon Nitride etch stop layer may be etched through according to a pattern established by the first and second hard mask portions. The first hard mask layer and the second hard mask layer may be formed of amorphous Silicon. The sidewall spacers may be formed of Silicon Dioxide. The plurality of mandrels may consist of Silicon Nitride, the sidewall spacers may be formed of Silicon Dioxide, the first hard mask layer and the second hard mask layer may be formed of amorphous Silicon, and a layer of amorphous Silicon may directly underlie the plurality of mandrels and the sidewall spacers. Etching the plurality of mandrels may remove the plurality of mandrels to expose the layer of amorphous Silicon. The second hard mask layer may be deposited directly on exposed areas of the layer of amorphous Silicon. Both the first and second hard mask portions may have lateral dimensions of approximately D/3 and spacing of approximately D/3.

An example of a method of forming an integrated circuit includes: forming a plurality of patterned portions using direct patterning photolithography; subsequently forming sidewall spacers along sidewalls of the plurality of patterned portions; subsequently filling gaps between sidewalls of neighboring patterned portions with first hard mask portions; subsequently removing the plurality of patterned portions; subsequently forming second hard mask portions in spaces where the plurality of patterned portions were removed, two second hard mask portions being formed in each space where an individual patterned portion was removed; subsequently removing the sidewall spacers; and subsequently using the first and second portions of the hard mask material to pattern one or more layers on a substrate.

The patterned portions may be formed of Silicon Nitride, or a combination of Silicon Nitride and amorphous Silicon. The sidewall spacers may be formed of Silicon Dioxide. The first and second hard mask portions may be formed of amorphous Silicon. A layer that directly underlies the sidewall spacers may be formed of Silicon Dioxide. The plurality of patterned portions may be formed having a lateral dimension D and the first and second hard mask portions may have a lateral dimension that is approximately one third of the lateral dimension D.

An example of a method of forming an integrated circuit includes: forming a plurality of mandrels; forming sidewall spacers along sides of the plurality of mandrels; subsequently removing the plurality of mandrels; subsequently depositing and etching a layer of sacrificial material to form first sacrificial portions between sidewall spacers and second sacrificial portions in openings where mandrels were removed, two second sacrificial portions formed per opening; subsequently forming filler portions in gaps between second sacrificial portions; subsequently removing the first and second sacrificial portions to leave the sidewall spacers and the filler portions; and subsequently using the sidewall spacers and the filler portions as a hard mask to pattern one or more layers.

The plurality of mandrels may be formed of Silicon Dioxide. The sidewall spacers and the filler portions may be formed of amorphous Silicon. The sacrificial material may be Silicon Dioxide. The sidewall spacers and the filler portions may be used as a hard mask to pattern an underlying layer of Silicon Nitride.

An example of a method of forming a hard mask layer includes: forming a plurality of stepped mandrel structures, an individual stepped mandrel structure having a lower step portion that has a width D and an upper step portion that has a width D/3, the upper step portion overlying a middle area of an upper surface of the lower step portion; forming lower sidewall spacers along sides of the lower step portions; forming upper sidewall spacers along sides of the upper step portions; subsequently depositing a hard mask material to fill spaces between lower sidewall spacers; removing upper step portions; etching the lower step portions according to a pattern of removed upper step portions so that an individual lower step portion is patterned into a first hard mask portion having a width of D/3 and a second hard mask portion having a width of D/3; and removing excess hard mask material to leave third hard mask portions between lower sidewall spacers.

Lower sidewall spacers and upper sidewall spacers may be formed together by depositing a blanket layer of sidewall spacer material and etching back the blanket layer of sidewall spacer material. The lower and upper sidewall spacers may be formed of Silicon Nitride. The hard mask material may be amorphous Silicon and the lower step portions may be formed of amorphous Silicon. The lower and upper sidewall spacers may be formed of amorphous Silicon. The hard mask material may be Silicon Nitride and the lower step portions may be formed of Silicon Nitride. The lower and upper sidewall spacers may be formed of Silicon Dioxide. The upper step portion may be formed of Silicon Nitride, hard mask material may be amorphous Silicon, and the lower step portions may be formed of amorphous Silicon. The upper step portions may be formed of Silicon Dioxide. The lower sidewall spacers and upper sidewall spacers may each have a width of D/3. Upper and lower step portions may be formed by direct pattern lithography to have an initial width D, followed by slimming of upper step portions to a width D/3.

An example of a method of forming an integrated circuit includes: forming a plurality of stepped mandrel structures, an individual stepped mandrel structure having an upper step portion overlying a middle area of an upper surface of a lower step portion; forming lower sidewall spacers along sides of the lower step portions and forming upper sidewall spacers along sides of the upper step portions, the upper sidewall spacers overlying side areas of the upper surface of the lower step portion; subsequently depositing a hard mask material to fill spaces between stepped mandrel structures; subsequently etching the lower step portions according to a pattern established by the upper sidewall spacers so that an individual lower step portion is patterned into a first hard mask portion and a second hard mask portion; and removing excess hard mask material to leave a third hard mask portion between adjacent stepped mandrel structures.

The upper step portion may be formed of Silicon Dioxide, the lower step portion may be formed of amorphous Silicon, the lower sidewall spacers and upper sidewall spacers may be formed of Silicon Nitride, and the hard mask material may be amorphous Silicon. The upper step portion may be formed of Silicon Dioxide, the lower step portion may be formed of Silicon Nitride, the lower sidewall spacers and upper sidewall spacers may be formed of amorphous Silicon, and the hard mask material may be Silicon Nitride. The upper step portion may be formed of Silicon Nitride, the lower step portion may be formed of amorphous Silicon, the lower sidewall spacers and the upper sidewall spacers may be formed of Silicon Nitride, and the hard mask material may be amorphous Silicon. Lower sidewall spacers may be removed to leave first, second, and third sidewall spacers, each having a width of D/3 and spaced apart a distance D/3. The first, second, and third sidewall spacers may be used to establish a pattern of word lines of a NAND flash memory array.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

BRIEF DESCRIPTION OF THE DRAWINGS

FIG. 1 is a block diagram of a prior art memory system.

DETAILED DESCRIPTION OF EXEMPLARY EMBODIMENTS

Memory System

Figure 2A:
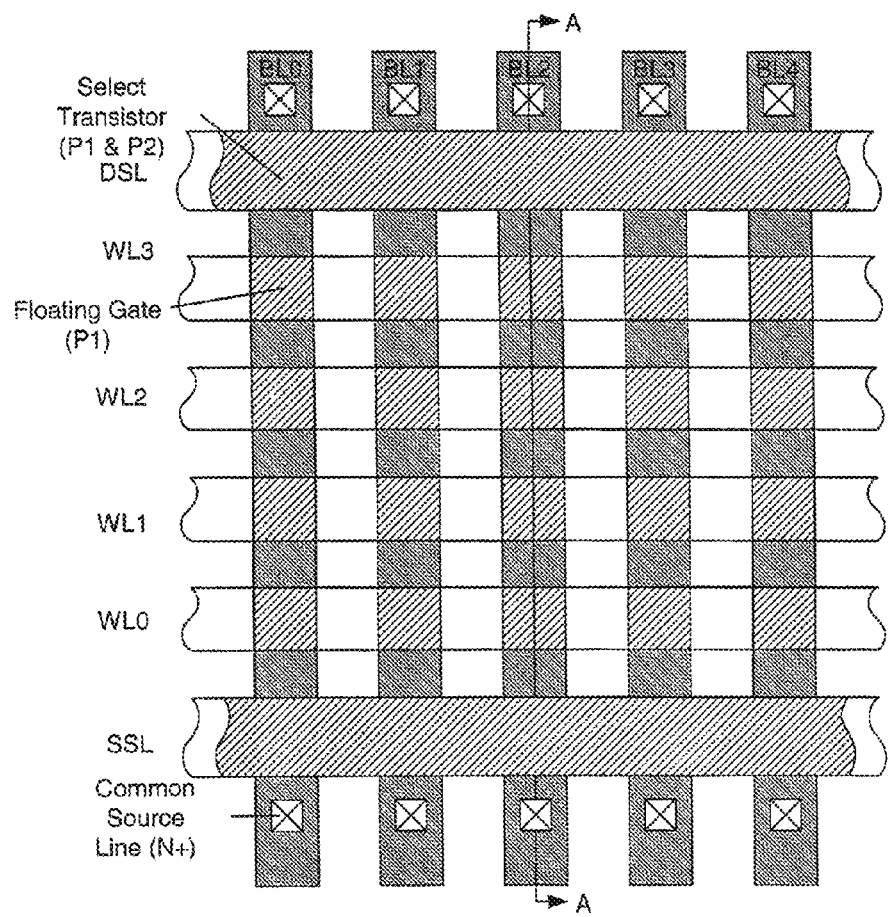
FIG. 2A is a plan view of a prior art NAND array.
Figure 2B:
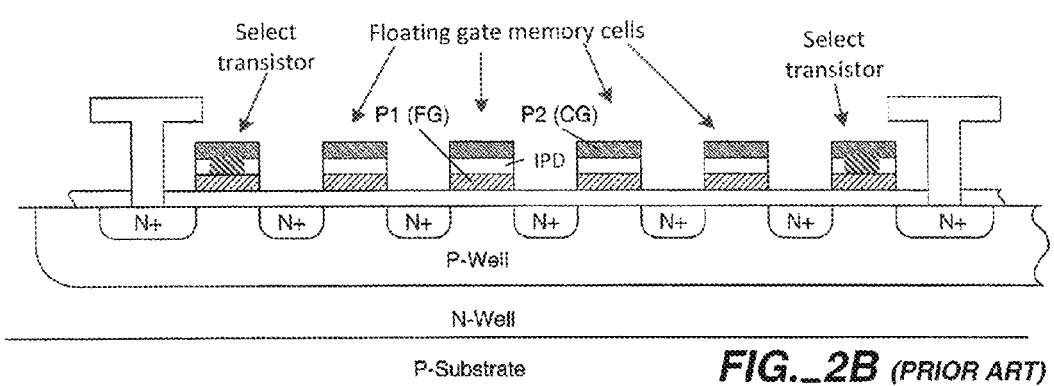
FIG. 2B is a cross-sectional view of the prior art NAND array of FIG. 2A taken along the line A-A.

An example of a prior art memory system, which may be modified to include various aspects of the present invention, is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

Many integrated circuits are formed using photolithographic patterning to establish dimensions of components. In some cases, direct patterning is used to create a pattern in a photoresist layer that is then transferred to a layer of material that becomes part of the integrated circuit. The dimensions of features formed by such direct patterning are generally limited by the minimum feature size achievable with the particular photolithographic process used (i.e. the smallest portion of photoresist, or opening in photoresist, that can be formed).

Some integrated circuits are formed using Sidewall Assisted Patterning (SAP), in which sidewalls are formed that may have smaller dimensions, and smaller spacing, than achievable with direct patterning. Examples of SAP are described in U.S. Pat. Nos. 8,194,470, and 7,960,266. In some examples of SAP, a pattern established by photolithography is then slimmed and sidewalls formed with a lateral dimension approximately half the size of the minimum achievable with photolithography, and with spacing approximately half the minimum achievable with photolithography. In some examples, sidewall patterning is repeated so that features may be formed with a lateral dimension approximately a quarter of the size, and spacing approximately a quarter of the size, of the minimum size achievable using direct patterning. However, there are several problems related to repeated SAP operations. A large number of layers are generally needed, the number of steps is large, and control of critical dimensions is difficult.

According to an aspect of the present invention, sidewalls are used to form features having lateral dimensions, and having spacing, that are approximately a third of the size achievable using direct patterning, using a relatively simple series of process steps that allows good control of critical dimensions. Thus, pitch can be reduced by a factor of three compared with a direct patterning process, while using relatively few layers and relatively few steps, and maintaining good control of critical dimensions compared with some SAP processes.

Figure 3A:
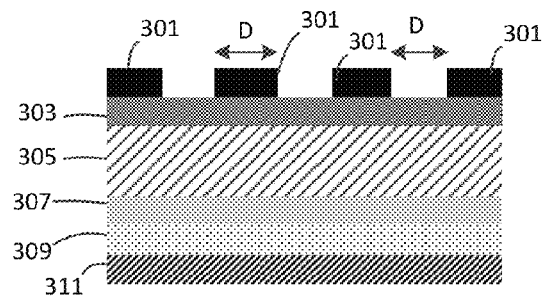
FIGS. 3A-3F illustrate a method of forming a NAND memory array.

FIG. 3A shows a cross section of a stack of layers formed on a semiconductor substrate (e.g. Silicon wafer) at an intermediate stage of fabrication. Multiple portions of photoresist 301 have been patterned by photolithography so that they have a lateral dimension, D, and are spaced apart an equal distance, D. The dimension, D, may be the minimum size achievable with the photolithographic process used, for example 51 nm. Under the photoresist portions is a layer of Spin-On Glass (SOG) 303, and under that a layer of Spin-On Carbon (SOC) 305. A transfer layer 307 (of Silicon Nitride, or SiN) underlies the SOC layer 305, with a layer of amorphous Silicon 309 under the transfer layer, and a layer of Silicon Dioxide 311 formed using TEOS ("Pad-TEOS) under the amorphous Silicon layer 309.

Figure 3B:
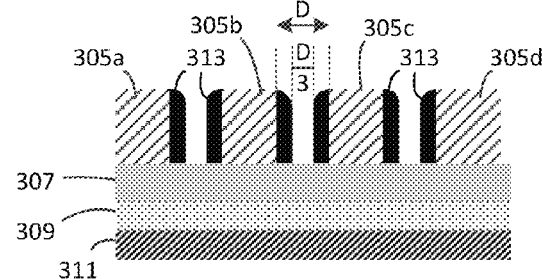

Subsequently, as shown in FIG. 3B, the pattern of photoresist portions 301 is used as an etch mask during an anisotropic etch (e.g. Reactive Ion Etching, or RIE) that transfers the photoresist pattern to underlying layers. In particular, the etch patterns the SOG layer 303, and the SOC layer 305. The photoresist portions 301 and SOG layer 303 are then removed and sidewall spacers 313 are formed on the sides of SOC portions 305a-d. In this example, sidewall spacers 313 are formed by depositing a blanket layer of Silicon Dioxide (SiO2) over SOC portions 305a-d. A sacrificial portion of material on which sidewalls are formed in this way, and which is later removed (such as portions 305a-d), may be referred to as a "mandrel."

Sidewall spacers may be formed of various materials. For example, Silicon Dioxide may be deposited by Atomic Layer Deposition (ALD) to a thickness of approximately D/3 (17 nm). The Silicon Dioxide layer may then be etched back to remove all Silicon Dioxide from top surfaces of SOC portions 305a-d, and along the underlying transfer layer 307, while leaving Silicon Dioxide sidewall spacers 313 as shown. The lateral dimension of the sidewall spacers 313 is approximately the deposited thickness, D/3 (17 nm), and the gap between such sidewall spacers is also approximately D/3 (original gap was D, with sidewall spacer of D/3 on each side, the remaining gap is D/3).

Subsequently, SOC portions 305a-d are also removed. In an example, removal of SOC portions is combined with etching back of Silicon Dioxide to form sidewall spacers. These two operations may be performed as two different steps (different etch conditions) of a combined process in a single etch chamber, or using a single etch (i.e. substantially the same etch conditions throughout).

Figure 3C:
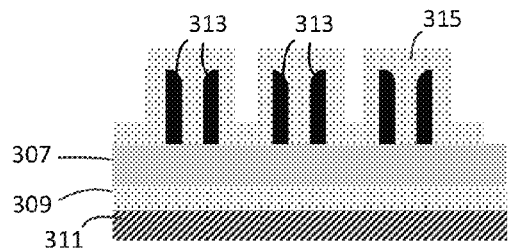

FIG. 3C shows a cross section of the structure of FIG. 3B following removal of SOC portions and deposition of a hard mask material 315, which in this example is amorphous Silicon. The hard mask material 315 is deposited so that it fills gaps between sidewall spacers 313 and lies along sides of sidewall spacers 313 where SOC was removed. Hard mask material is deposited to a thickness of D/3 (17 nm in this example). Subsequently, the hard mask material 313 is etched back.

Figure 3D:
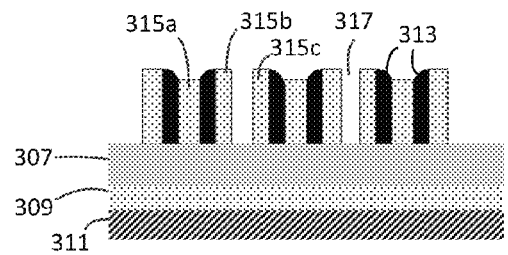

FIG. 3D shows a cross section of the structure of FIG. 3C after etching back of the hard mask material 315 to remove hard mask material that is on top of sidewall spacers 313, and where the hard mask material extends across the underlying transfer Silicon Nitride 307. The remaining hard mask portions are separated from each other by sidewall spacers 313 and by gaps. There are two different types of hard mask portions. A first type of hard mask portion (e.g. portions 315a) is formed between sidewall spacers and extends from one sidewall spacer to a neighboring sidewall spacer. Because gaps between sidewall spacers were approximately D/3 wide, the first type of hard mask portion has a lateral dimension of approximately D/3. A second type of hard mask portion is formed at locations where SOC portions were removed, with two of the second type of hard mask portion in each such location (e.g. portions 315b, 315c). The second type of hard mask portions each lie along a sidewall spacer on one side and have a gap (e.g. gap 317) on the other side (the second hard mask portions may themselves be considered as sidewall spacers that are formed along sides of original sidewall spacers 313). Etching back of the hard mask material leaves second hard mask portions that are approximately D/3 wide, and separated by gaps that are approximately D/3 wide.

Figure 3E:
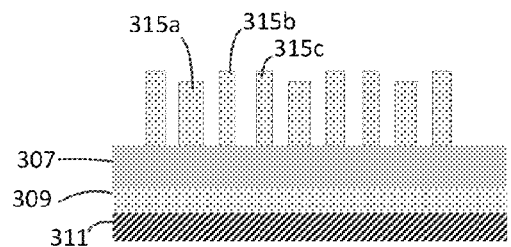

FIG. 3E shows a cross section of the structure of FIG. 3D after removal of sidewall spacers 313. Hard mask portions (e.g. portions 315a-c) remain. While there are two different types of hard mask portions that may be somewhat different in height, both types of hard mask portions have lateral dimensions approximately D/3 (17 nm in this example) and are separated from their neighbors (of whichever type) by approximately D/3. Thus, a pattern of hard mask portions is established at this stage with dimensions approximately one third the size of the original photoresist portions. Subsequently, this pattern may be used to pattern various layers used to form components in an integrated circuit.

Figure 3F:
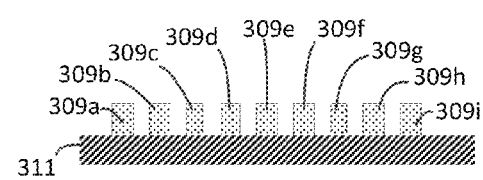

FIG. 3F shows a cross section of the structure of FIG. 3E after the pattern established by the first and second types of hard mask portions is transferred to the transfer Silicon Nitride layer 307 and subsequently transferred to the amorphous Silicon layer 309 that underlies the transfer Silicon Nitride layer 307, and after removal of Silicon Nitride layer 307. Portions of amorphous Silicon 309a-i remain in a pattern established by hard mask portions (e.g. 315a-c). It will be understood that once a pattern of hard mask portions is established it may be transferred to one or more underlying layers in order to pattern layers from which integrated circuit components are formed. For example, a pattern of amorphous Silicon portions such as shown in FIG. 3F may be transferred to underlying Silicon Dioxide (Pad-TEOS) layer 311, and subsequently to underlying layers including metal and/or dielectric layers used to form components of a memory array (e.g. to form word lines or floating gates).

Figure 4:
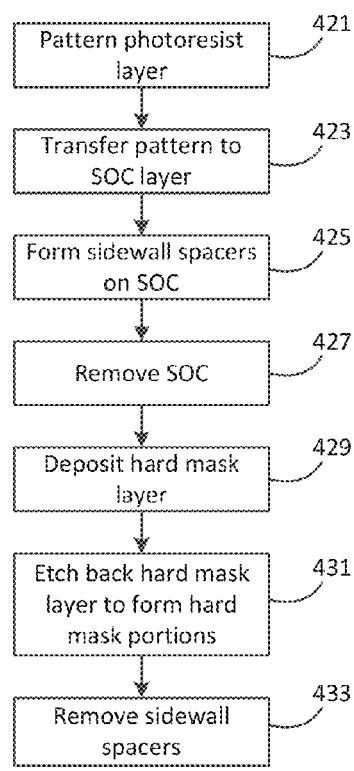
FIG. 4 illustrates steps used to form a NAND memory array.

FIG. 4 illustrates certain steps in the process described above (it will be understood that there may be additional conventional steps also). A photoresist layer is patterned 421 to produce photoresist portions of a certain size. The photoresist pattern is then transferred to an SOC layer 423 where SOC portions are formed. Sidewall spacers are then formed on the SOC portions 425 by depositing sidewall material and performing anisotropic etch back to leave sidewalls. The SOC portions are then removed 427. In some cases etch back of sidewall material and SOC removal may be combined (e.g. performed in the same etch chamber). A layer of hard mask material is then deposited over the sidewall spacers 429. The hard mask material is then etched back to form hard mask portions 431, including first hard mask portions that extend from one sidewall spacer to a neighboring sidewall spacer and second hard mask portions that extend along a sidewall spacer on one side and have a gap on the other side. Sidewall spacers are then removed 433. Additional steps (not shown) may transfer the pattern of hard mask portions formed to one or more underlying layers.

While the above example shows certain aspects of the present invention, other process steps may also be used, and process steps may be performed in different orders, and/or different materials may be used.

Figure 5A:
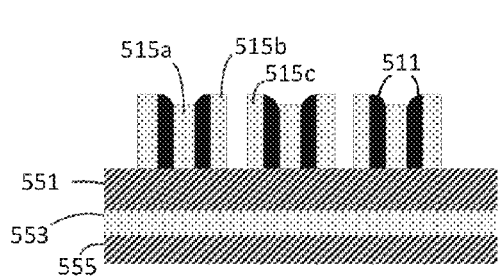
FIGS. 5A-5B illustrate another method of forming a NAND memory array.

FIG. 5A shows a cross section of a stack of layers at an intermediate stage of fabrication that is similar to 3D above. In this case, transfer Silicon Nitride is replaced with a layer of Silicon Dioxide 551 that is formed using TEOS. Silicon Dioxide layer 551 is formed on amorphous Silicon layer 553, which is formed on Silicon Dioxide (Pad-TEOS) layer 555. Both the sidewall spacers 511 and the underlying layer 551 are formed of Silicon Dioxide in this example. An appropriate etch may be chosen that is selective to Silicon Dioxide over amorphous Silicon so that amorphous Silicon hard mask portions (e.g. portions 515a-c) and underlying amorphous Silicon layer 553 remain substantially unaffected.

Figure 5B:
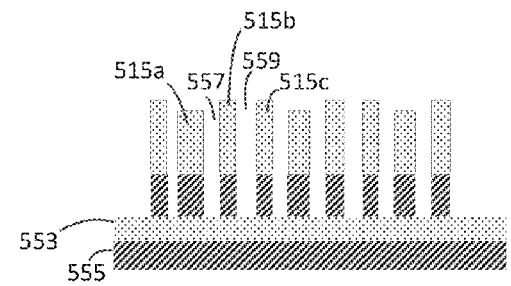

FIG. 5B shows a cross section of the stack of FIG. 5A after an anisotropic etch is performed to remove sidewall spacers 511, and to pattern the underlying Silicon dioxide layer 551. The underlying amorphous Silicon layer 553 acts as an etch stop so that openings where sidewall spacers 511 are removed (e.g. opening 557) achieve the same depth as openings defined by gaps between hard mask portions (e.g. gap 559).

Aspects of the present invention are not limited to particular materials, but may be implemented with any suitable materials. For example, while amorphous Silicon is used as a hard mask layer in the examples above, Silicon Nitride may be used as an alternative hard mask material which may allow fewer layers (e.g. transfer Silicon Nitride may not be necessary).

Figure 6A:
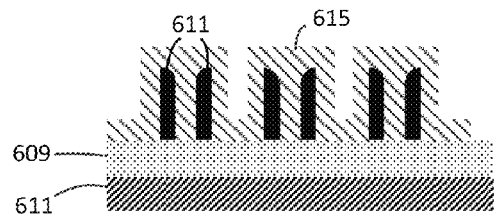
FIGS. 6A-6B illustrate a method of forming a NAND memory array using SiN hard mask portions.

FIG. 6A shows a cross section of a stack of layers at an intermediate stage of fabrication that is similar to FIG. 3C above. However, in this case hard mask layer 615 is formed of Silicon Nitride. In the example above, transfer Silicon Nitride was needed to provide selectivity between hard mask amorphous Silicon an underlying layer of amorphous Silicon. Here, sidewall spacers 611 and hard mask layer 615 are formed directly on an amorphous Silicon layer 609 (which is on Pad-TEOS Silicon Dioxide layer 611). A Silicon Nitride hard mask layer may be formed by Atomic Layer Deposition (ALD) or using a Diclorosilane (DCS) based Chemical Vapor Deposition (CVD) process to a depth of D/3 (17 nm in this example). This layer may then be etched back using an appropriate anisotropic etch.

Figure 6B:
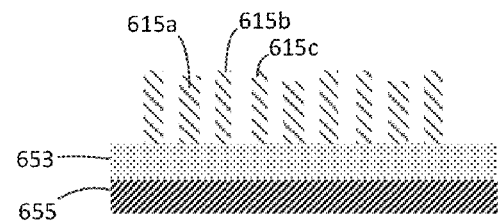

FIG. 6B shows a cross section of the stack of FIG. 6A after etching back the hard mask, Silicon Nitride layer using anisotropic etching, to form hard mask portions (e.g. portions 615*a-c*) as before, using an etch that is selective to Silicon Nitride over amorphous Silicon. Subsequent removal of sidewall spacers 611 uses an etch that selectively removes Silicon Dioxide while leaving Silicon Nitride hard mask portions and underlying amorphous Silicon layer.

While the above examples form sidewall spacers on SOC portions (mandrels), sidewalls may be formed on portions of other materials also. A suitable mandrel material may be chosen that is compatible with the sidewall spacer material and hard mask material and with underlying layers. In general, it is desirable to use a material for which an etch is available that allows removal of mandrels without significantly damaging other materials (i.e. a selective etch exists with high selectivity to the mandrel material).

Figure 7A:
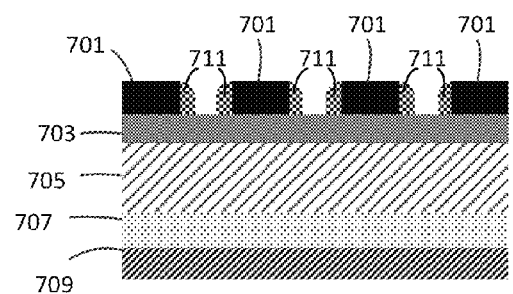
FIGS. 7A-7D illustrate a method of forming a NAND memory including forming sidewall spacers on photoresist portions.

FIG. 7A shows an example where sidewall spacers 711 are formed on sides of photoresist portions 701. Sidewall spacers 711 are formed of Silicon Dioxide that is deposited over patterned photoresist and then etched back to leave sidewall spacers 711 as shown. Dimensions of sidewall spacers may be D/3 with gaps of D/3 as before. Subsequently, photoresist portions 701 are removed, the pattern of sidewall spacers 711 is transferred to the underlying SOG layer 703 and SOC layer 705, and sidewall spacers 711 and underlying SOG portions are removed. For efficiency, these steps may be performed in the same etch chamber, for example an RIE chamber.

Figure 7B:
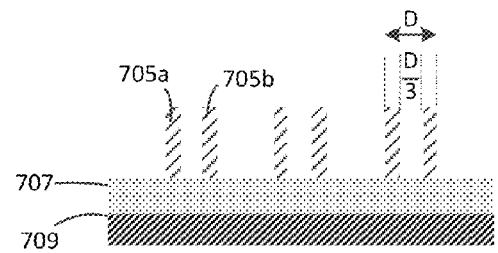

FIG. 7B shows a cross section of the stack of layers of FIG. 7A after an RIE chamber is used to remove photoresist, and to anisotropically etch down through the SOG and SOC layers according to the pattern of sidewall spacers, remove the sidewall spacers, and remove remaining SOG. This sequence of process steps leaves SOC portions (e.g. portions 705*a*, 705*b*) that are in the same pattern as the sidewall spacers 711.

Figure 7C:
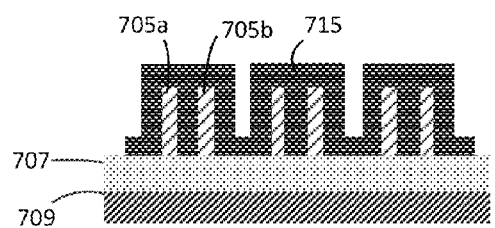

FIG. 7C shows a cross section of the stack of FIG. 7B after deposition of a hard mask layer 715 over the SOC portions (e.g. 705*a*, 705*b*). The hard mask layer 715 may be formed of Silicon Dioxide or other suitable material with a thickness of D/3 as before. Because this layer is deposited on SOC, it may be deposited at low temperature in what may be considered an Ultra-Low Temperature (ULT) Silicon Dioxide deposition.

Figure 7D:
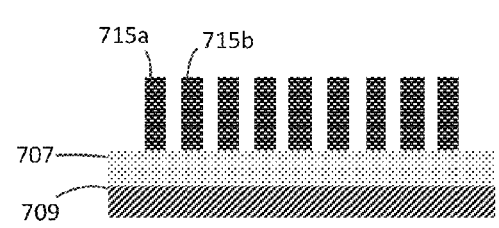

FIG. 7D shows a cross section of the stack of FIG. 7C after etching back of the hard mask layer 715 to leave hard mask portions (e.g. hard mask portions 715*a*, 715*b*), and after removal of SOC portions (e.g. portions 705*a*, 705*b*).

The SOC portions may be removed by an asking process in the same chamber that is used to etch back the hard mask layer 715 (e.g. an RIE chamber used for anisotropic etch and for ashing). While this example does not directly use sidewall spacers to define hard mask portions, it uses a pattern that is established by sidewall spacers and then transferred to SOC portions, with the pattern of hard mask portions then established by SOC portions. So hard mask portions are similarly of two types, a first type that is defined on both sides by locations of sidewall spacers, and a second type that is defined on only one side by a location of a sidewall spacer.

Figure 8:
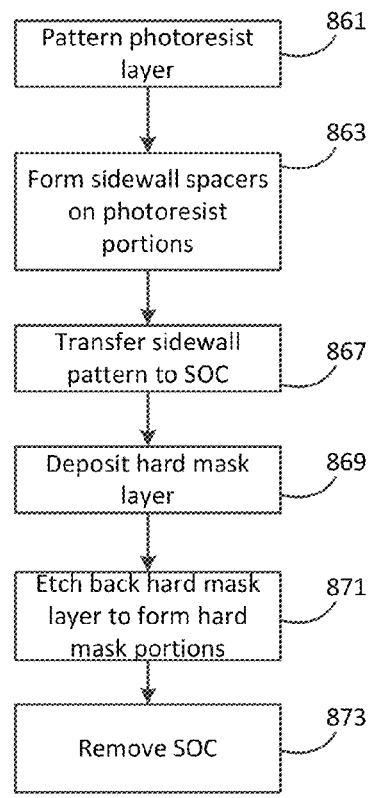
FIG. 8 illustrates steps used in the process of FIGS. 7A-7D.

FIG. 8 illustrates certain steps used in a process as described in FIGS. 7A-7D. A photoresist layer is patterned 861 as before to have features with size D, that are spaced apart a distance D. Then, sidewall spacers are formed along sides of the photoresist portions 863, with sidewall spacers having a width about D/3. The pattern of sidewall spacers is then transferred to an underlying SOC layer 867. A hard mask material is deposited 869 over the patterned SOC to a thickness of about D/3. The hard mask layer is etched back to form individual hard mask portions 871. The SOC portions are then removed 873.

While the above examples are concerned with forming very small features in a memory array, in many cases it is desirable to form larger features on the same die. For example, certain devices formed in the peripheral area of a memory die may be required to have dimensions larger than those in the array. The above processes for forming small features in a memory array are compatible with forming larger features in other areas and this may be achieved in any suitable manner including, but not limited to, the example described below.

Figure 9A:
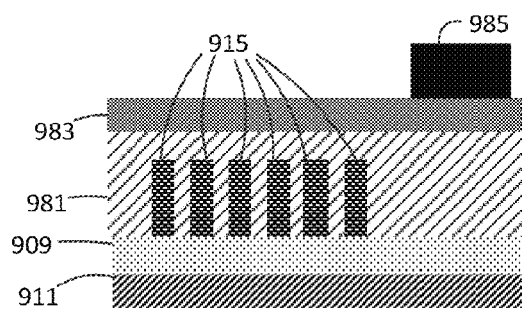
FIGS. 9A-9B illustrate formation of smaller features in a memory array and larger features in a peripheral area of a memory die.

FIG. 9A shows an example where hard mask portions 915 have been formed having very small dimensions (e.g. mask portions having dimensions D/3 as described in any of the above examples). The hard mask portions overlie an amorphous Silicon layer 909 and a Silicon Dioxide (Pad-TEOS) layer 911. After the hard mask portions 915 are formed, an SOC layer 981 is formed overlying the hard mask 915 portions and an SOG layer 983 is formed on top of SOC layer 981. Subsequently, a photoresist layer may be formed and patterned into photoresist portions (e.g. photoresist portion 985) to define features in the periphery, while leaving the array area open. Subsequently, anisotropic etching (e.g. RIE) may be performed to remove SOG layer 983 and SOC layer 981 in the array area, and in unmasked areas of the periphery. Thus, hard mask portions 915 remain to define small features in the array area, while larger SOG and SOC portions define larger features in a peripheral area.

Figure 9B:
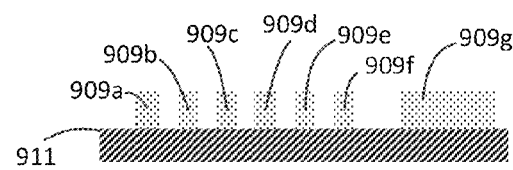

FIG. 9B shows the cross section of FIG. 9A after transfer of the pattern of hard mask portions to the underlying amorphous Silicon layer 909 and transfer of the photoresist pattern, including photoresist portion 985, to the same amorphous Silicon layer to establish amorphous Silicon portions 909*a-g*. The amorphous Silicon layer may be considered a hard mask layer that defines both small features and large features. Amorphous Silicon portions 909*a-f* correspond to hard mask portions 915, which each have a lateral dimension of D/3, while amorphous Silicon portion 909*g* corresponds to photoresist portion 985 and therefore has a lateral dimension that is at least D, where D is the minimum feature size achievable by direct patterning. Thus, the above examples of producing very small features in one area of an integrated circuit (e.g. memory array area) are compatible with producing larger features in another area of the same integrated circuit (e.g. peripheral area). Examples below are similarly compatible with producing larger features.

Processes without SOC

Figure 10A:
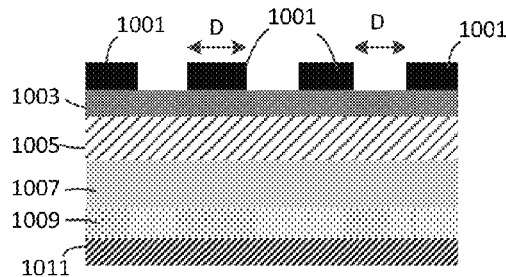
FIGS. 10A-10G illustrate another method of forming a NAND memory array.

The above process examples use SOC as one of the materials in forming a memory array. However, SOC is not essential, and other processes may be used that do not require SOC. An alternative process for producing features with a lateral dimension of D/3 from an original pattern having lateral dimensions of D is shown in FIGS. 10A-10G. This process does not require SOC. In FIG. 10A a stack of materials is formed on a substrate and a photoresist layer is formed and patterned on top to form photoresist portions 1001 with lateral dimensions D, and spacing D. Underlying the photoresist portions is an antireflective coating layer containing Carbon, "CTL layer" 1003, then a layer of sacrificial Silicon Nitride 1005, then a layer of amorphous Silicon 1007, then an etch stop layer 1009, which in this case is Silicon Nitride. Under the etch stop layer 1009 is pad TEOS Silicon Dioxide layer 1011 and other layers (not shown) including layers that are patterned into components of the memory array (e.g. floating gate layer of doped polysilicon that is subsequently formed into individual floating gates). The photoresist portions 1001 are used to pattern the stack down to etch stop layer 1009 using anisotropic etching so that the pattern of photoresist portions 1001 is transferred to underlying layers.

Figure 10B:
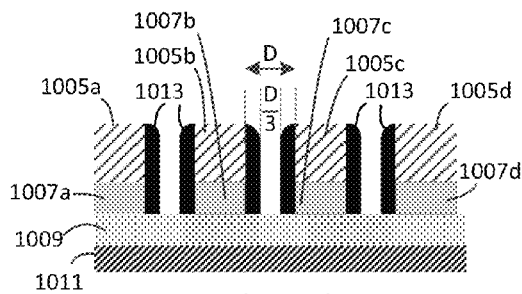

FIG. 10B shows the structure of FIG. 10A after etching using photoresist portions 1001 as a mask. Photoresist portions 1001 and remaining CTL are then removed to leave portions of sacrificial Silicon Nitride 1005*a-d* and portions of amorphous Silicon 1007*a-d* formed together in the same pattern. FIG. 10B also shows sidewall spacers 1013 that are formed along sidewalls of the Silicon nitride and amorphous Silicon portions. Sidewall spacers 1013 may be formed as described above, from Silicon Dioxide, by depositing a blanket layer of Silicon Dioxide and etching back to leave sidewall spacers. The thickness of the Silicon Dioxide layer is approximately D/3 in this example so that sidewall spacers have a width of D/3 and gaps between sidewall spacers are D/3 wide.

Figure 10C:
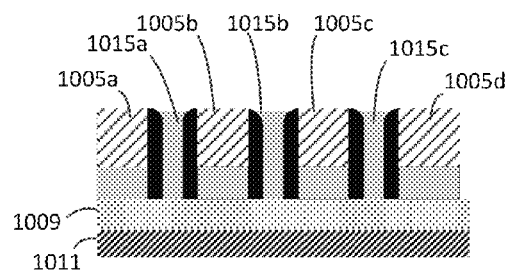

FIG. 10C shows the structure of FIG. 10B after deposition and etch back of an amorphous Silicon hard mask layer that fills gaps between sidewall spacers 1013 and overlies sacrificial Silicon Nitride portions 1005*a-d*. This layer may be etched back to approximately the level of the tops of sacrificial Silicon Nitride portions 1005*a-d*, leaving amorphous Silicon hard mask portions 1015*a-c*.

Figure 10D:
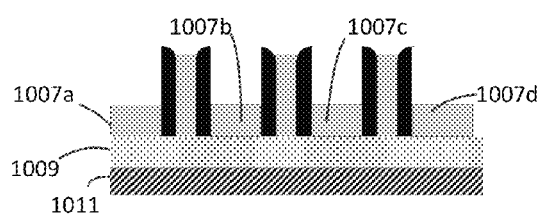

FIG. 10D shows the structure of FIG. 10C after removal of sacrificial Silicon Nitride portions 1005*a-d* to leave underlying portions of amorphous Silicon 1007*a-d* exposed. A suitable selective etch may be used.

Figure 10E:
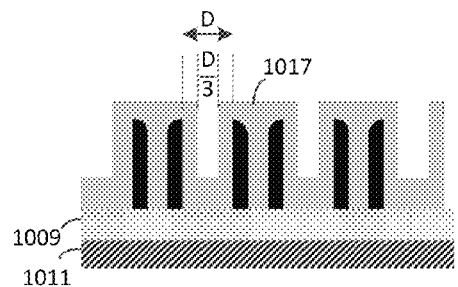

FIG. 10E shows the structure of FIG. 10D after deposition of another amorphous Silicon hard mask layer 1017 that extends into the openings left by the removal of sacrificial Silicon Nitride portions 1005*a-d*. This layer may be deposited to a thickness of D/3 so that openings are partially filled, with gaps of D/3 remaining in the middle of openings.

Figure 10F:
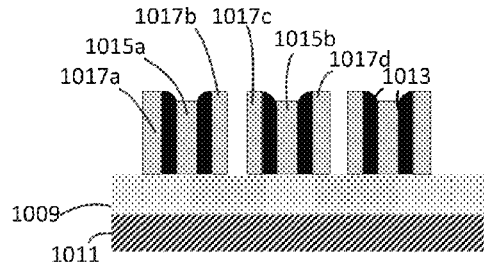

FIG. 10F shows the structure of FIG. 10E after etching back amorphous Silicon hard mask layer 1017 to leave hard mask portions (e.g. portions 1017*a-d*) along sides of sidewall spacers 1013. Etching back amorphous Silicon hard mask layer 1017 also leaves hard mask portions (e.g. portions 1015*a-c*) intact between sidewall spacers.

Figure 10G:
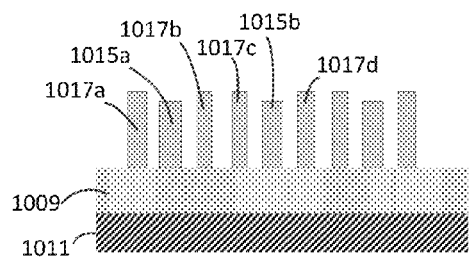

FIG. 10G shows the structure of FIG. 10F after removal of sidewall spacers 1013 to leave first hard mask portions (e.g. portions 1015*a-f*) and second hard mask portions (e.g. portions 1017*a-d*). The pattern shown in FIG. 10G includes two different types of hard mask portions. First hard mask portions 1015*a-b* were formed between sidewall spacers and were defined on both sides by sidewall spacers (i.e. the locations of their sides is determined by locations of sidewall spacers). The lateral dimensions of these hard mask portions is equal to the distance between sidewall spacers 1013 (D/3 in this example). Second hard mask portions 1017*a-d* were formed along sides of sidewall spacers and are defined on only one side by a sidewall spacer. They are defined on the other side by gaps. The lateral dimensions of these hard mask portions is equal to the thickness of the amorphous Silicon layer 1017 (D/3 in this example). Thus, using two different types of hard mask portions, a pattern is established with portions having a lateral dimension of D/3 and spacing of D/3.

Figure 11A:
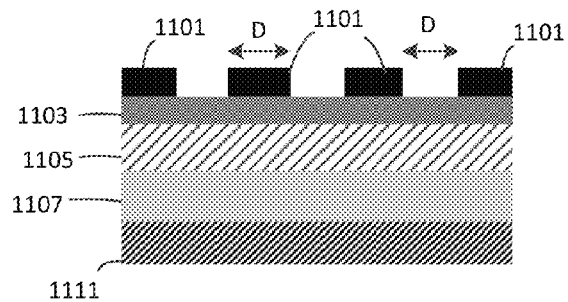
FIGS. 11A-11F illustrate another method of forming a NAND memory array.

FIGS. 11A-11F show an alternative process that is similar to the process of FIGS. 10A-10G. The initial stack of layers shown in FIG. 11A is similar to that of FIG. 10A except that no etch stop layer is present. Thus, under the patterned photoresist layer (photoresist portions 1101) is CTL layer 1103, then sacrificial Silicon Nitride layer 1105, then amorphous Silicon layer 1107, then pad TEOS Silicon Dioxide 1111.

Figure 11B:
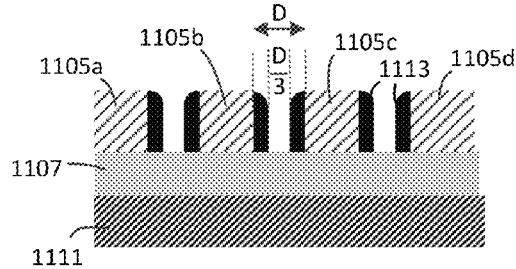

FIG. 11B shows the structure of FIG. 11A after etching of the stack in the pattern established by photoresist portions 1101. However, in this process, the etch stops on the top surface of amorphous Silicon layer 1107 instead of patterning amorphous Silicon layer 1107. Sidewall spacers 1113 are then formed on the upper surface of amorphous Silicon layer 1107 (along sides of Silicon Nitride portions 1105*a-d*).

Figure 11C:
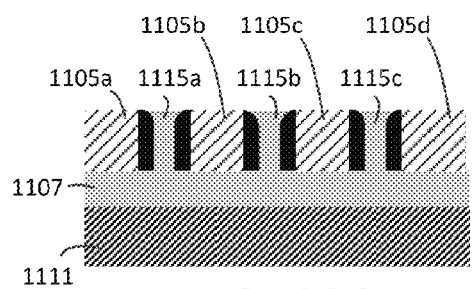

FIG. 11C shows the structure of FIG. 11B after deposition and etch back of a first amorphous Silicon hard mask layer to leave first amorphous Silicon hard mask portions 1115*a-c* between sidewall spacers as before.

Figure 11D:
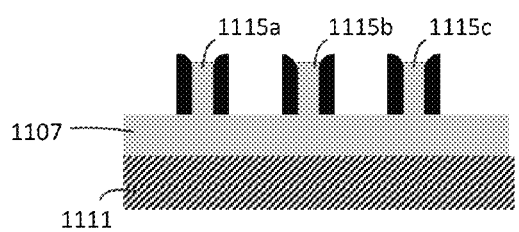

FIG. 11D shows the structure of FIG. 11C after removal of sacrificial Silicon Nitride portions 1105*a-d* to leave amorphous Silicon 1107 exposed.

Figure 11E:
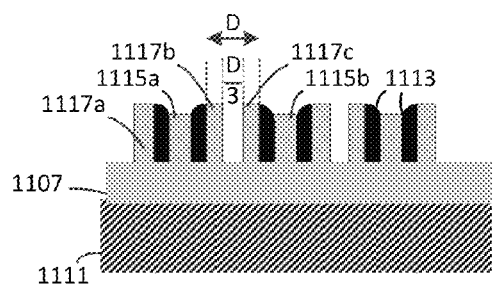

FIG. 11E shows the structure of FIG. 11C after deposition and etch back of a second amorphous Silicon hard mask layer to leave second amorphous Silicon hard mask portions (e.g. portions 1117*a-c*).

Figure 11F:
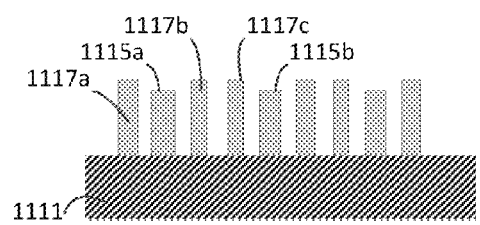

FIG. 11F shows the structure of FIG. 11E after removal of sidewall spacers 1113 and etching of the amorphous Silicon layer 1107 in the pattern of hard mask portions down to the underlying Silicon Dioxide layer 1111. Thus, at this point, a hard mask pattern is established of two different kinds of hard mask portions, first portions (e.g. portions 1115*a-b*) which are formed between sidewall spacers and are defined on each side by sidewall spacers, and second portions (e.g. portions 1117*a-c*), which are formed on sides of sidewall spacers with a sidewall spacer on one side and a gap on the other side.

Figure 12A:
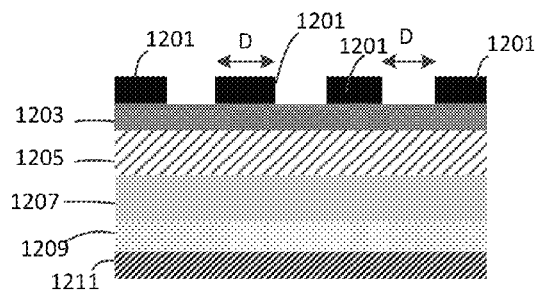
FIGS. 12A-12F illustrate another method of forming a NAND memory array.
Figure 12B:
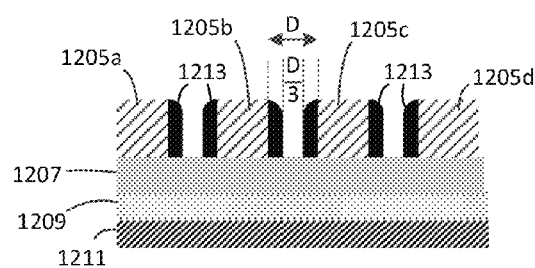
Figure 12C:
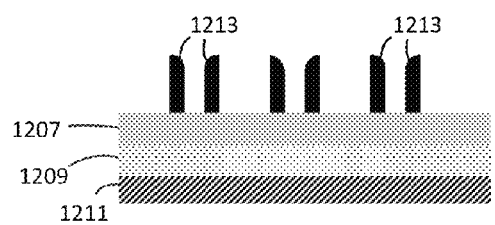

FIGS. 12A-C show another process that uses mandrels formed of sacrificial Silicon Dioxide instead of Silicon Nitride. FIG. 12A shows a stack of layers with patterned photoresist portions 1201 on top of CTL layer 1203, on sacrificial Silicon Dioxide layer 1205, on a transfer Silicon Nitride layer 1207, on amorphous Silicon layer 1209, on Silicon Dioxide (pad TEOS) layer 1211.

FIG. 12B shows the structure of FIG. 12A after etching the stack using photoresist portions 1201 as an etch mask, stopping on an upper surface of transfer Silicon Nitride layer 1207. Photoresist and CTL are removed and sidewalls 1213 are formed between sacrificial Silicon Dioxide portions 1205*a-d*. In this case sidewall spacers 1213 are formed of amorphous Silicon that is deposited as a blanket layer and then etched back to leave sidewall spacers as shown. Sidewall spacers have a width of D/3 so that a gap of D/3 remains between such sidewall spacers.

FIG. 12C shows the structure of FIG. 12B after removal of sacrificial Silicon Dioxide portions 1205a-d to leave sidewall spacers 1213.

Figure 12D:
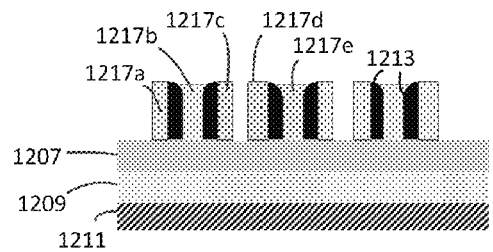

FIG. 12D shows the structure of FIG. 12C after deposition and etching back of a Silicon Dioxide layer to fill gaps between neighboring sidewall spacers and to partially fill spaces where sacrificial Silicon Dioxide portions were removed. This layer may be deposited to a thickness of D/3 so that portions of Silicon Dioxide (e.g. portion 1217a) have a width of D/3 and leave gaps of D/3.

Figure 12E:
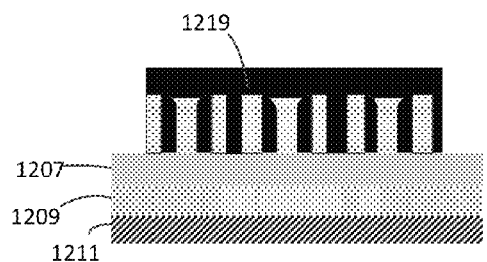

FIG. 12E shows the structure of FIG. 12D after deposition of an amorphous Silicon hard mask layer 1219 that fills gaps between Silicon dioxide portions 1217a-c.

Figure 12F:
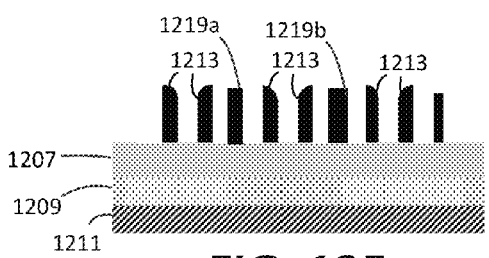

FIG. 12F shows the structure after etching back of the amorphous Silicon layer 1219 and subsequent removal of Silicon dioxide portions 1217a-c to leave amorphous Silicon sidewall spacers 1213 and hard mask portions 1219a-f. Amorphous Silicon sidewall spacers 1213 may be considered as hard mask portions and in conjunction with hard mask portions 1219a-c form a hard mask with portions having a lateral dimension D/3 and spacing of D/3. This pattern may then be transferred to one or more underlying layers.

Stepped Mandrels

In an alternative approach, mandrels may be formed with two steps that have two different lateral dimensions. Then sidewall spacers may be formed on sides of each step and the upper step removed to allow the lower step to be etched in the middle, leaving portions on either side.

Figure 13A:
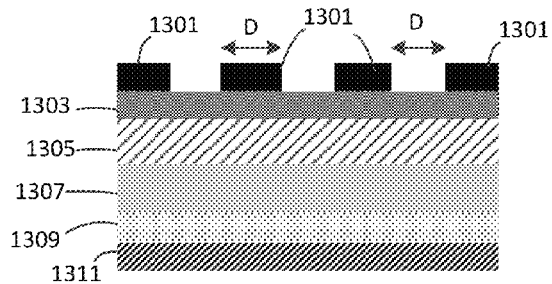
FIGS. 13A-13F illustrate a method of forming a NAND memory array using a stepped mandrel.

FIG. 13A shows a stack of layers that includes portions of photoresist 1301 with lateral dimension D and spacing D as before. Underlying the photoresist portions 1301 is a layer of CTL 1303 formed on a sacrificial Silicon Dioxide layer 1305, on an amorphous Silicon layer 1307, on a Boron doped polysilicon layer 1309, on Silicon Dioxide (pad TEAS) 1311.

Figure 13B:
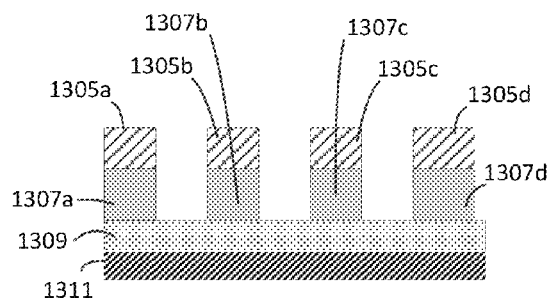

FIG. 13B shows the structure of FIG. 13A after etching according to the pattern of photoresist portions 1301 to form separate portions of sacrificial Silicon Dioxide 1305a-d and amorphous Silicon 1307a-d. Photoresist and CTL are removed. The etch stops on the doped polysilicon layer 1309.

Figure 13C:
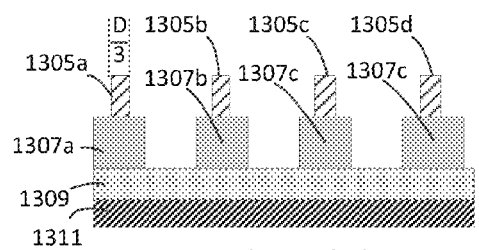

FIG. 13C shows the result of a slimming operation that reduces the lateral dimensions of sacrificial Silicon Dioxide portions 1305a-d from D to D/3 to form upper steps while maintaining lateral dimensions of amorphous Silicon portions 1307a-d unchanged at D. Thus, stepped mandrels are formed with an upper step having a width D/3 located on the middle third of an upper surface of a lower step that has a width D.

Figure 13D:
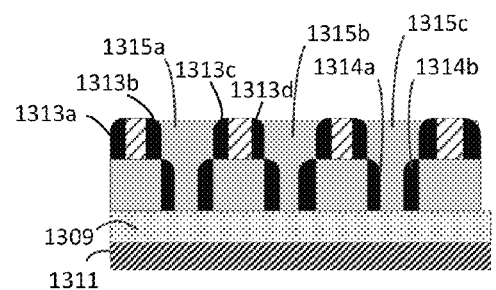

FIG. 13D shows the structure of FIG. 13C after formation of upper sidewall spacers (e.g. spacers 1313a-d) and lower sidewall spacers (e.g. spacers 1314a-f) on sides of both upper and lower steps of the stepped mandrel structures formed of sacrificial Silicon Dioxide portions on amorphous Silicon portions. Such sidewall spacers may be faulted as before, by blanket deposition of a sidewall spacer layer (in this case, a Silicon Nitride layer) followed by etching back. FIG. 13D also shows amorphous Silicon portions 1315a-c filling gaps between sidewall spacers. Amorphous Silicon may be deposited across the structure and then etched back to remove excess amorphous Silicon, leaving sufficient amorphous Silicon to fill gaps as shown.

Figure 13E:
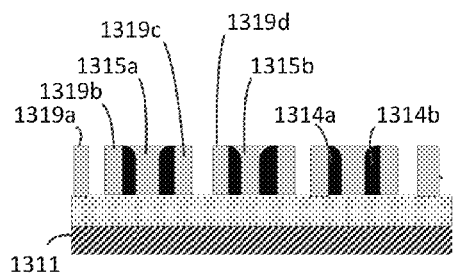

FIG. 13E shows the structure of FIG. 13D after removal of upper steps (portions of sacrificial Silicon Dioxide 1305a-d) and subsequent etching of lower steps (amorphous Silicon portions 1307a-d) according to the pattern of removed upper steps to form two amorphous Silicon portions each with a lateral dimension of D/3 from each lower step (e.g. portions 1319a-d). Upper sidewall spacers are removed and amorphous Silicon etched back to leave etched amorphous Silicon portions (e.g. portions 1315a-b) between lower sidewall spacers (e.g. portions 1314a-d).

Figure 13F:
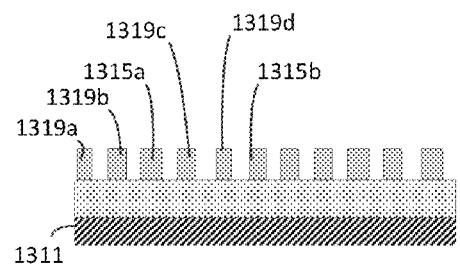

FIG. 13F shows the structure of FIG. 13E after subsequent etching to remove sidewall spacers. At this point hard mask portions (e.g. portions 1315a-b and 1319a-d) are to form a hard mask pattern with portions having lateral dimensions of D/3 and spacing of D/3.

Figure 14A:
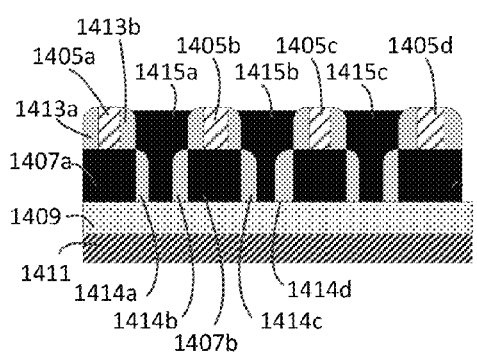
FIGS. 14A-14B illustrate another method of forming a NAND memory array using a stepped mandrel.
Figure 14B:
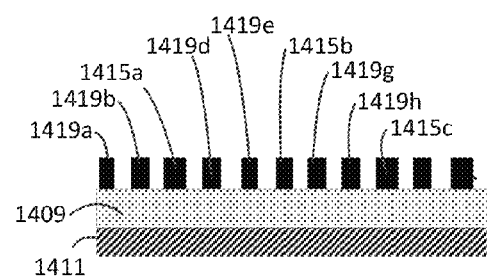

The materials used in the example of FIGS. 13A-F are provided as examples and aspects of the present invention may be practiced with a range of materials. FIGS. 14A-B provide another example of materials that may be used. It will be understood that other materials may also be used.

FIGS. 14A-B show an example a process that is similar to that of FIGS. 13A-F but using Silicon Nitride as a material for lower steps (e.g. lower steps 1407a-b) and using amorphous Silicon as a sidewall spacer material (the opposite of the example above) for upper sidewall spacers (e.g. upper sidewall spacers 1413a-c) and lower sidewall spacers (e.g. lower sidewall spacers 1414a-d). In FIG. 14A, Silicon Nitride portions 1415a-c fill gaps between sidewall spacers and are etched back to a level that leaves sacrificial Silicon Dioxide portions 1405a-d exposed for later removal.

FIG. 14B shows the structure of FIG. 14A after removal of sacrificial Silicon Dioxide portions and etching of Silicon Nitride lower steps (e.g. portions 1407a-b) in the pattern established by removal of sacrificial Silicon Dioxide portions 1405a-d. Upper sidewall spacers (e.g. spacers 1413a-b) are removed, Silicon Dioxide portions (e.g. portions 1415a-c) are etched back, and lower sidewall spacers (e.g. spacers 1414a-d) are removed to leave only the Silicon Nitride portions shown. These Silicon Nitride portions include first Silicon Nitride portions 1415a-c formed between lower sidewall spacers, and second Silicon Nitride portions 1419a-c formed from lower steps. All such Silicon Nitride portions have lateral dimensions of D/3 and spacing D/3.

Figure 15A:
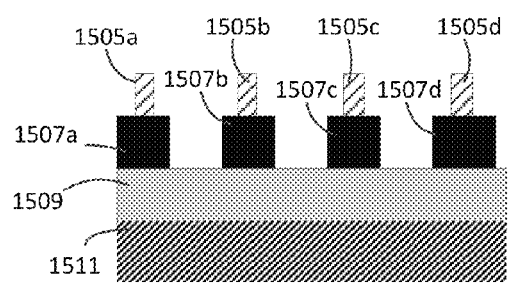
FIG. 15A-15B illustrate another method of forming a NAND memory array using a stepped mandrel.

Slimming may be used to form a stepped mandrel for forming upper and lower sidewall spacers as described above. Alternatively, a stepped structure may be formed and then transferred to lower layers where sidewall spacers are formed. For example, FIG. 15A shows an example of a stepped structure formed with slimmed steps 1505a-d that are formed of sacrificial Silicon Dioxide and unslimmed steps 1507a-d formed of Silicon Nitride. Rather than form sidewall spacers on this structure, the pattern is transferred prior to forming sidewall spacers.

Figure 15B:
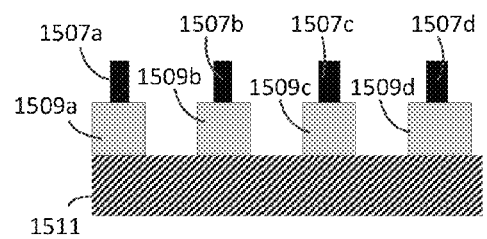

FIG. 15B shows the same cross section after etching of underlying amorphous Silicon layer 1509 according to the pattern of unslimmed steps 1507a-d to form lower steps 1509a-d, and etching of steps 1507a-d according to the pattern of slimmed steps 1505a-d to form upper steps 1507a-d with a dimension D/3. Thus, the pattern of FIG. 15A has been transferred down by one layer in this example. Upper and lower sidewall spacers may subsequently be formed, amorphous Silicon deposited, upper steps removed and used to pattern lower steps, followed by removal of upper and lower sidewall spacers and etching back of amorphous Silicon to leave a hard mask with individual portions having lateral dimensions D/3 and spacing of D/3

CONCLUSION

Although the various aspects of the present invention have been described with respect to exemplary embodiments It is claimed:

1. A method of forming a hard mask layer comprising:
    forming a plurality of mandrels that have a lateral dimension D which is defined by a photolithographic process and which are separated by spaces having a lateral dimension equal to D;
    subsequently forming sidewall spacers of a first material along and in direct contact with sides of the mandrels, gaps between neighboring sidewall spacers having a lateral dimension approximately equal to D/3;
    subsequently depositing a first hard mask layer of a second material to completely fill the gaps between the sidewall spacers with the second material;
    subsequently etching the plurality of mandrels to expose sides of the sidewall spacers;
    subsequently depositing a second hard mask layer of the second material to partially fill openings where the plurality of mandrels were etched, the second hard mask layer lying along and in direct contact with the sides of the sidewall spacers of the first material exposed by the etching;
    subsequently etching back the second material of at least the second hard mask layer to leave first hard mask portions completely filling the gaps between sidewall spacers and second hard mask portions that extend along and in direct contact with the sidewall spacers on one side and are exposed on another side;
    wherein both the first and second hard mask portions have lateral dimensions of approximately D/3 and spacing of approximately D/3; and
    subsequently removing the sidewall spacers.

2. The method of claim 1 wherein an individual mandrel is formed of a lower layer of amorphous Silicon and an upper layer of Silicon Nitride.

3. The method of claim 2 wherein etching the plurality of mandrels removes the upper layer of Silicon Nitride from the plurality of mandrels while leaving the lower layer of amorphous Silicon substantially intact.

4. The method of claim 3 wherein the plurality of mandrels, and the sidewall spacers, are formed on a Silicon Nitride etch stop layer.

5. The method of claim 4 further comprising, subsequent to removing the sidewall spacers, etching through the Silicon Nitride etch stop layer according to a pattern established by the first and second hard mask portions.

6. The method of claim 1 wherein the first hard mask layer and the second hard mask layer are formed of amorphous Silicon.

7. The method of claim 1 wherein the sidewall spacers are formed of Silicon Dioxide.

8. The method of claim 1 wherein the plurality of mandrels consist of Silicon Nitride, the sidewall spacers are formed of Silicon Dioxide, the first hard mask layer and the second hard mask layer are formed of amorphous Silicon, and wherein a layer of amorphous Silicon directly underlies the plurality of mandrels and the sidewall spacers.

9. The method of claim 8 wherein etching the plurality of mandrels removes the plurality of mandrels to expose the layer of amorphous Silicon.

10. The method of claim 9 wherein the second hard mask layer is deposited directly on exposed areas of the layer of amorphous Silicon.

11. A method of forming an integrated circuit comprising:
    forming a plurality of patterned portions using direct patterning photolithography;
    subsequently forming sidewall spacers of a first material along and in direct contact with sidewalls of the plurality of patterned portions;
    subsequently completely filling gaps between sidewalls of neighboring patterned portions with first hard mask portions of a second material that lie in direct contact with sidewall spacers on either side;
    subsequently removing the plurality of patterned portions;
    subsequently forming second hard mask portions of the second material in spaces where the plurality of patterned portions were removed, two second hard mask portions being formed in each space where an individual patterned portion was removed, each hard mask portion lying in direct contact with a sidewall spacer on one side;
    wherein both the first and second hard mask portions have lateral dimensions of approximately D/3 and spacing of approximately D/3;
    subsequently removing the sidewall spacers; and
    subsequently using the first hard mask portions of the second material and the second hard mask portions of the second material to pattern one or more layers on a substrate.

12. The method of claim 11 wherein the patterned portions are formed of Silicon Nitride, or a combination of Silicon Nitride and amorphous Silicon.

13. The method of claim 12 wherein the sidewall spacers are formed of Silicon Dioxide.

14. The method of claim 13 wherein the first and second hard mask portions are formed of amorphous Silicon.

15. The method of claim 14 wherein a layer that directly underlies the sidewall spacers is formed of Silicon Dioxide.

16. The method of claim 11 wherein the plurality of patterned portions are formed having a lateral dimension D and wherein the first and second hard mask portions have a lateral dimension that is approximately one third of the lateral dimension D.

* * * * *